(12) United States Patent
Happ

(10) Patent No.: US 7,339,814 B2
(45) Date of Patent: Mar. 4, 2008

(54) PHASE CHANGE MEMORY ARRAY HAVING EQUALIZED RESISTANCE

(75) Inventor: Thomas Happ, Tarrytown, NY (US)

(73) Assignee: Infineon Technologies AG, Munich (DE)

( * ) Notice: Subject to any disclaimer, the term of this patent is extended or adjusted under 35 U.S.C. 154(b) by 248 days.

(21) Appl. No.: 11/210,525

(22) Filed: Aug. 24, 2005

(65) Prior Publication Data

US 2007/0053221 A1 Mar. 8, 2007

(51) Int. Cl.
*G11C 11/00* (2006.01)
(52) U.S. Cl. .................. 365/148; 365/63; 365/163
(58) Field of Classification Search ........... 365/148, 365/63, 163
See application file for complete search history.

(56) References Cited

U.S. PATENT DOCUMENTS 5,825,683 A * 10/1998 Chang .................... 365/63
6,456,525 B1 * 9/2002 Perner et al. ............. 365/148

OTHER PUBLICATIONS

S. J. Ahn et al., "Highly Manufacturable High Density Phase Change Memory of 64Mb and Beyond", IEDM 2004.
H. Horii et al., "A Novel cell technology using N-doped GeSbTe films for phase change RAM", VLSI, 2003.
Y. N. Hwang et al., "Full Integration and reliability evaluation of phase-change RAM based on 0.24μm-CMOS technologies", VLSI, 2003.
S. Lai et al., "OUM-a 180 nm nonvolatile memory cell element technology for stand alone and embedded applications", IEDM 2001.
Y. H Ha et al., "An edge contact type cell for phase change RAM featuring very low power consumption", VLSI, 2003.
W. Y. Cho et al., "A 0.18 um 3.0-V 64-Mb nonvolatile phase transition random access memory (PRAM)", IEEE J. Sol. State Circuits 40 (1), 293, 2005.
F. Bedeschi et al., "A 8Mb demonstrator for high density 1.8V Phase-change memories", VLSI 2004.

* cited by examiner

*Primary Examiner*—Tuan T. Nguyen
(74) *Attorney, Agent, or Firm*—Dicke, Billing & Czaja, PLLC

(57) ABSTRACT

A memory includes memory cells, a first line coupled to the memory cells, and a second line coupled to the memory cells. A series resistance due of the first line plus the second line at each one of the memory cells is substantially equal.

16 Claims, 17 Drawing Sheets

PHASE CHANGE MEMORY ARRAY HAVING EQUALIZED RESISTANCE

BACKGROUND

Phase-change materials exhibit at least two different states. The states of phase-change material may be referenced to as amorphous and crystalline states. The states may be distinguished because the amorphous state generally exhibits higher resistivity than does the crystalline state. Generally, the amorphous state involves a more disordered atomic structure, white the crystalline state is an ordered lattice. Some phase-change materials exhibit two crystalline states, e.g. a face-centered cubic (FCC) state and a hexagonal closest packing (HCP) state. These two crystalline states have different resistivities. In the following description, the amorphous state generally refers to the state having the higher resistivity, and the crystalline state generally refers to the state having the lower resistivity.

Phase change in the phase-change materials may be induced reversibly. In this way, the phase-change material may change from the amorphous state to the crystalline state, and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. With any of these methods, controllable heating of the phase-change material causes controllable phase change within the phase-change material.

An array of phase-change memory cells includes bit line and ground line wiring. Since the bit line and ground line wiring have a parasitic resistance, the set and reset current fed through a phase-change memory cell during the application of a voltage write pulse depends on the location of the phase-change memory cell in the memory array. This location dependent set and reset current contributes to a broadening of the phase-change memory cell resistance distribution and thereby affects the reliability of the phase-change memory cell set and reset operations. Typical solutions to this problem attempt to minimize the resistance or adjust the set and reset current based on the location of the phase-change memory cell within the memory array to compensate for the voltage drop over the bit line. These methods increase the costs of the phase-change memory due to increased process complexity and chip complexity.

SUMMARY

One embodiment of the present invention provides a memory. The memory includes memory cells, a first line coupled to the memory cells, and a second line coupled to the memory cells: A series resistance of the first line plus the second line at each one of the memory cells is substantially equal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
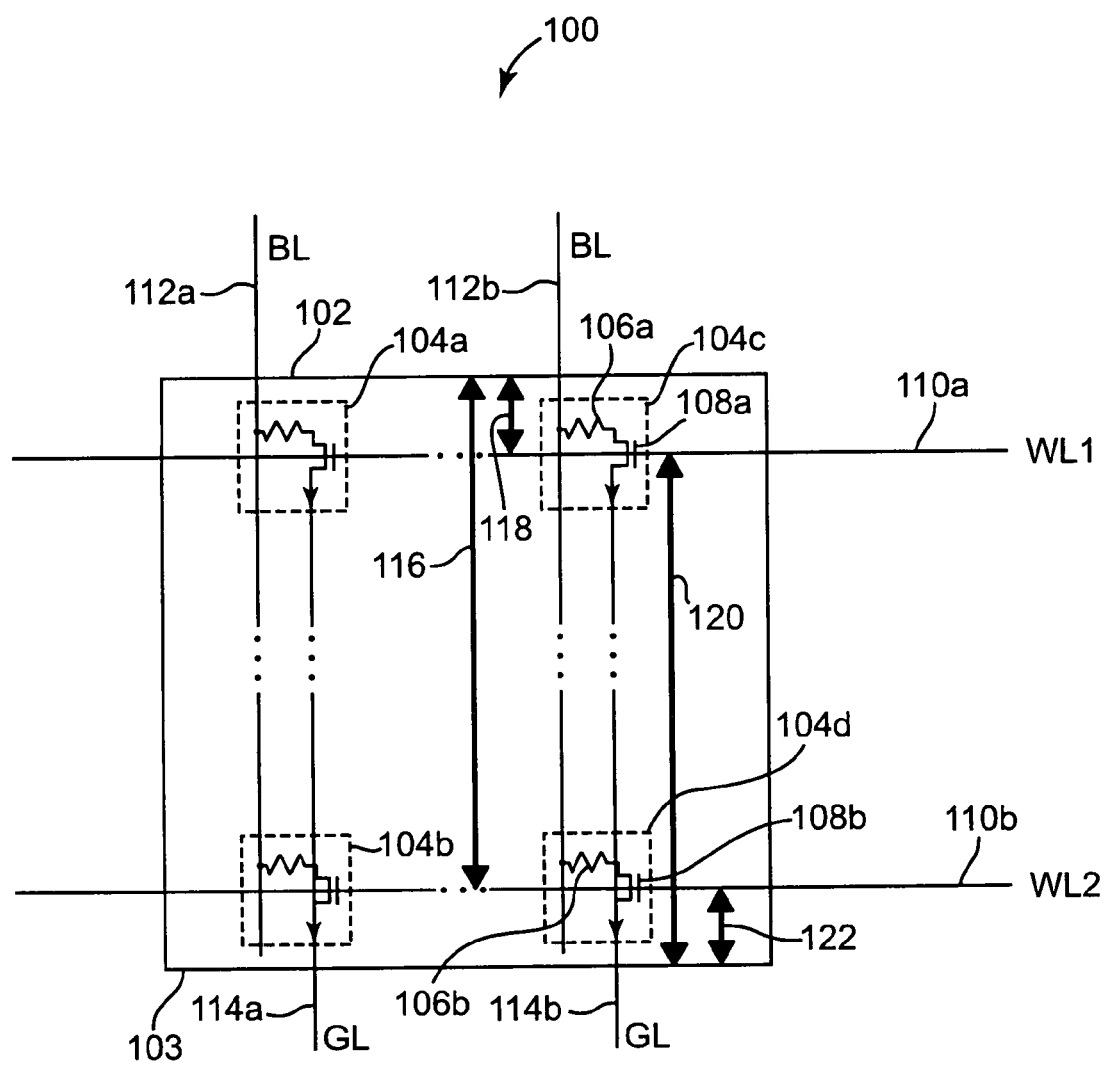
FIG. 1 is a diagram illustrating one embodiment of a memory.

FIG. 1 is a diagram illustrating one embodiment of a memory 100. Memory 100 include a plurality of phase-change memory cells 104a-104d (collectively referred to as phase-change memory cells 104), a plurality of first lines 112a-112b (collectively referred to as first lines 112), a plurality of select lines 110a-110b (collectively referred to as select lines 110), and a plurality of second lines 114a-114b (collectively referred to as second lines 114). Each phase-change memory cell 104 is electrically coupled to a select line 110, a first line 112, and a second line 114. While phase-change memory cells 104 are used in the illustrated embodiment, in other embodiments, other suitable types of memory cells can be used. In the following description, first lines 112 are referred to as bit lines 112, second lines 114 are referred to as ground lines 114, and select lines 110 are referred to as word lines 110 due to the use of phase-change element 106 and field-effect transistor (FET) 108 within phase-change memory cell 104. Thus, phase-change memory cell 104c is electrically coupled to bit line (BL) 112b, word line (WL1) 110a, and ground line (GL) 114b, and phase-change memory cell 104d is electrically coupled to bit line 112b, word line (WL2) 110b, and ground line 114b.

The set and reset current fed through a phase-change memory cell 104 of phase-change memory cell array 100 does not depend on the location of the phase-change memory cell in memory array 100. Memory array 100 balances the unavoidable, position dependent voltage drop over bit lines 112 by a voltage drop over ground lines 114, which has the inverse location dependence such that the total series resistance due to the wiring is constant for each phase-change memory cell 104 in memory array 100. The total series resistance for each phase-change memory cell 104 is made equal by the parallel routing of bit lines 112 and ground lines 114 and the connection of bit lines 112 and ground lines 114 at opposite sides 102 and 103 of memory array 100, respectively, so that the total wiring length in memory array 100 is the same for each phase-change memory cell 104.

To equalize the series resistance due to the bit line and ground line wiring, each bit line 112 and each ground line 114 has the same resistance per length (resistance/length). The same resistance/length can be achieved by a reduction in thickness of the higher metallization line (e.g., Al, Cu) which typically has a lower resistivity than lower metallization levels (e.g., W). In one embodiment, bit lines 112 and ground lines 114 in memory array 100 run in parallel and the line resistance of bit lines 112 and the line resistance of ground lines 114 are approximately equal so that the actual write voltage of an individual phase-change memory cell 104 is not dependent on the position of phase-change memory cell 104 in memory array 100. This is due to a constant sum of the voltage drop over bit line 112 and ground line 114 for each phase-change memory cell 104. In one embodiment, memory array 100 includes two memory cells 104a and 104b. In this embodiment, bit line 112a and ground line 114a run in parallel and the line resistance of bit line 112a and the line resistance of ground line 114a are approximately equal. In other embodiments, one or more of the bit lines 112 have an orientation to one or more of the ground lines 114 that is not parallel.

In the illustrated embodiment, each phase-change memory cell 104 includes a phase-change element 106 and a transistor 108. While transistor 108 is a FET in the illustrated embodiment, in other embodiments, transistor 108 can be other suitable devices such as a bipolar transistor or a 3D transistor structure. In the illustrated embodiment, phase-change memory cell 104c includes phase-change element 106a and transistor 108a. One side of phase-change element 106a is electrically coupled to bit line 112b and the other side of phase-change element 106a is electrically coupled to one side of the source-drain path of transistor 108a. The other side of the source-drain path of transistor 108a is electrically coupled to ground line 114b. The gate of transistor 108a is electrically coupled to word line 110a. Phase-change memory cell 104d includes phase-change element 106b and transistor 108b. One side of phase-change element 106b is electrically coupled to bit line 112b and the other side of phase-change element 106b is electrically coupled to one side of the source-drain path of transistor 108b. The other side of the source-drain path of transistor 108b is electrically coupled to ground line 114b. The gate of transistor 108b is electrically coupled to word line 110b.

In various embodiments, each phase-change element 106 comprises a phase-change material that may be made up of a variety of suitable materials in accordance with the present invention. Generally, chalcogenide alloys that contain one or more elements from group VI of the periodic table are useful as such materials. In one embodiment, the phase-change material of phase-change element 106 is made up of a chalcogenide compound material, such as GeSbTe, SbTe, or AgInSbTe. In another embodiment, the phase-change material can be chalcogen free, such as GeSb, GaSb, or GeGaSb.

In the illustrated embodiment, bit lines 112 are connected to additional circuits on one side 102 of memory array 100, and ground lines 114 are connected to additional circuits on another side 103 of memory array 100. Side 102 of memory array 100 is opposite side 103 of memory array 100. In one embodiment, bit lines 112 are parallel to ground lines 114.

In other embodiments, bit lines 112 can have other suitable orientations to ground lines 114. In the illustrated embodiment, the length of bit line 112b from phase-change memory cell 104c to side 102 of memory array 100 is indicated at 118, and the length of bit line 112b from phase-change memory cell 104d to side 102 of memory array 100 is indicated at 116. The length of ground line 114b from phase-change memory cell 104c to side 103 of memory array 100 is indicated at 120, and the length of ground line 114b from phase-change memory cell 104d to side 103 of memory array 100 is indicated at 122.

In the illustrated embodiment, the length 118 of bit line 112b from phase-change memory cell 104c to side 102 of memory array 100 plus the length 120 of ground line 114b from phase-change memory cell 104c to side 103 of memory array 100 is equal to the length 116 of bit line 112b from memory cell 104d to side 102 of memory array 100 plus the length 122 of ground line 114b from phase-change memory cell 104d to side 103 of memory array 100. In this embodiment, bit line 112b and ground line 114b have the same resistance/length so that the series resistance due to bit line 112b and ground line 114b are equal for both phase-change memory cells 104c and 104d. In other embodiments, different resistance and lengths can be used for bit line 112b and ground line 114b such that the series resistance due to bit line 112b and ground line 114b are equal for both phase-change memory cells 104c and 104d.

In the illustrated embodiment, the series resistance due to bit lines 112 and ground lines 114 for each phase-change memory cell 104 in memory array 100 is substantially equal. Therefore, the write current and/or voltage for setting or resetting a phase-change memory cell 104 is the same for all phase-change memory cells 104 in memory array 100. While four memory cells 104 are illustrated in FIG. 1, in other embodiments, two memory cells 104 are used and are coupled to the same bit line 112 and ground line 114.

In the illustrated embodiment, during a set operation for phase-change memory cell 104c, a set current and/or voltage pulse is selectively enabled and sent through bit line 112b to phase-change element 106a thereby heating it above it's crystallization temperature (but usually below it's melting temperature) with word line 110a selected to activate transistor 108a. In this way, phase-change element 106a reaches its crystalline state during this set operation. During a reset operation of phase-change memory cell 104c, a reset current and/or voltage pulse is selectively enabled to bit line 112b and sent to phase-change material element 106a. The reset current or voltage quickly heats phase-change element 106a above its melting temperature. After the current and/or voltage pulse is turned off, the phase-change element 106a quickly quench cools into the amorphous state. Phase-change memory cell 104d and other phase-change memory cells 104 in array 100 are set and reset similarly to phase-change memory cell 104c using the same current and/or voltage pulse value.

Figure 2A:
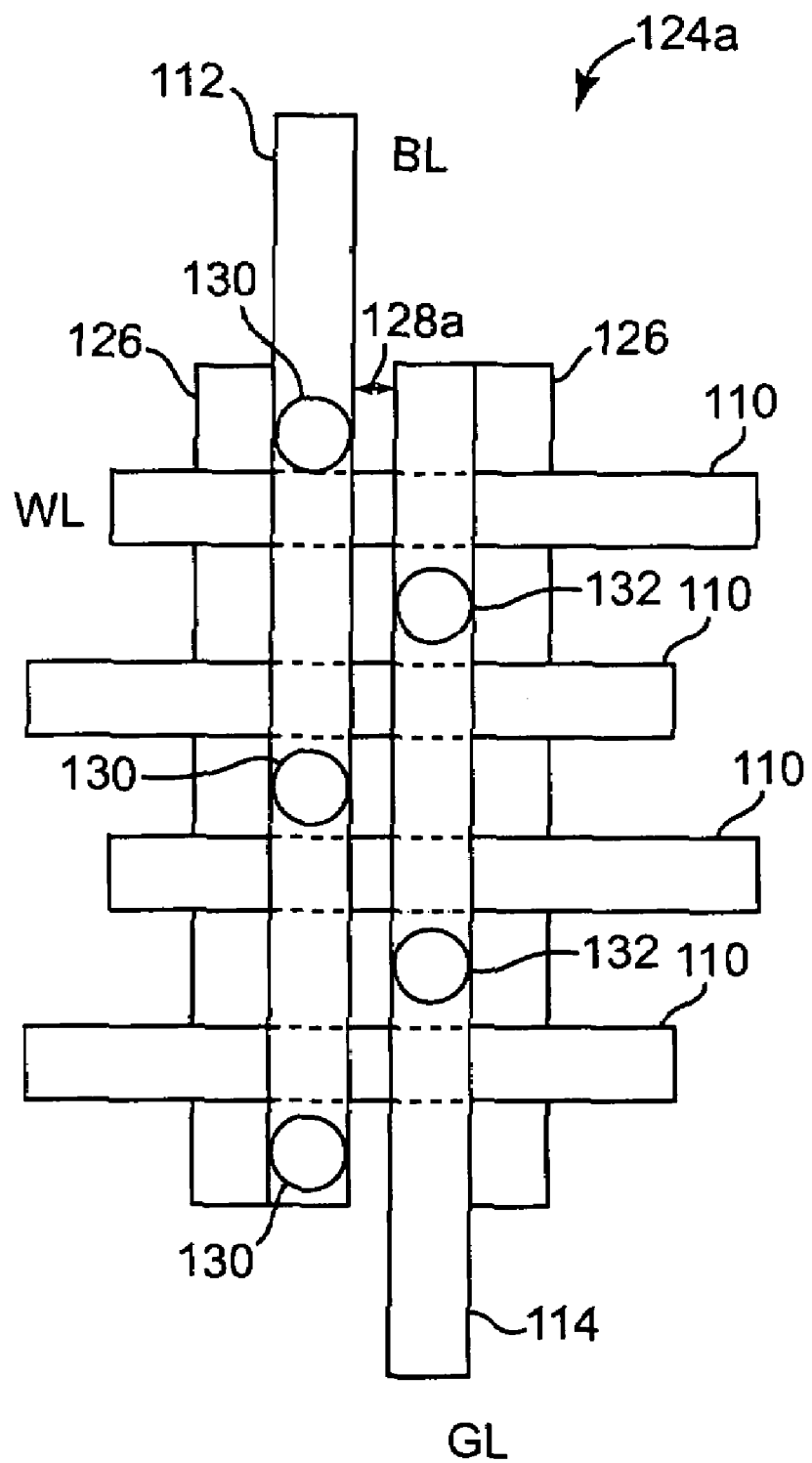
FIG. 2A illustrates a top view of one embodiment of a layout for dual gate phase-change memory cells.
Figure 2B:
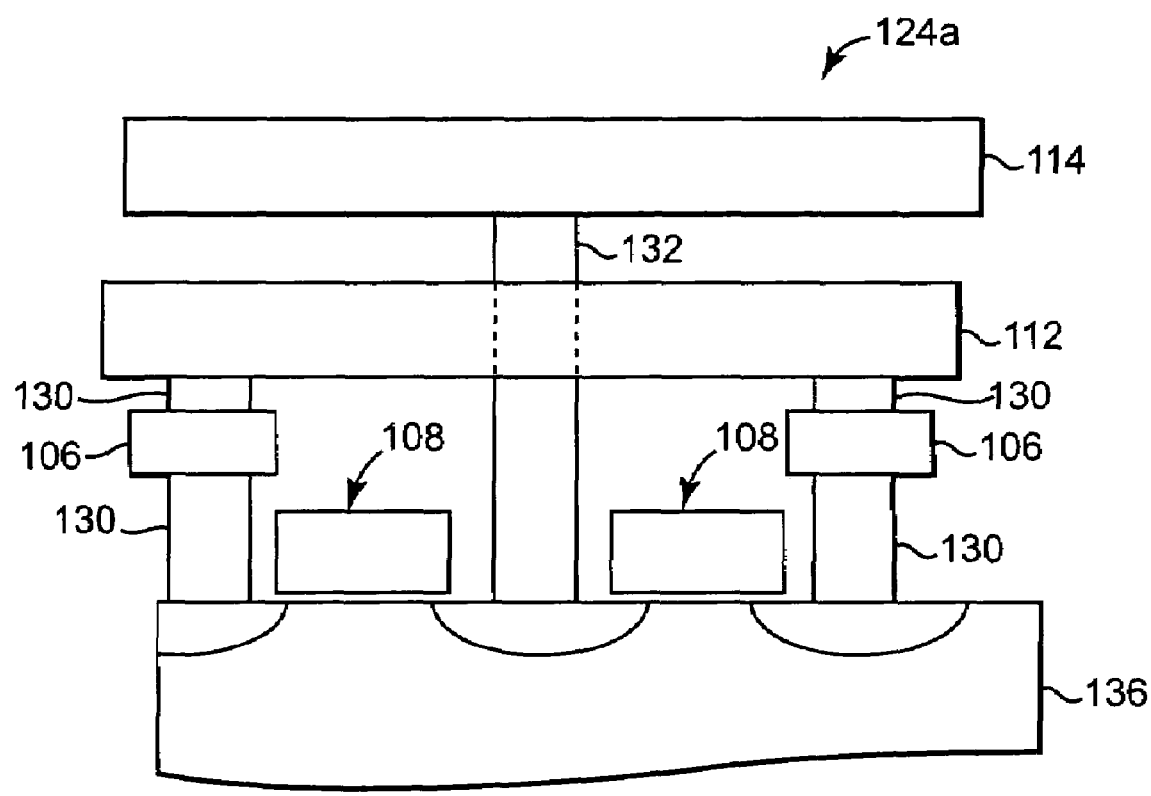
FIG. 2B illustrates a side view of one embodiment of a layout for dual gate phase-change memory cells.

FIG. 2A illustrates a top view and FIG. 2B illustrates a side view of one embodiment of a layout 124a for dual gate phase-change memory cells. Dual gate phase-change memory cells include two transistors 108 that are-both shared and support one phase-change element 106. Layout 124a includes substrate 136, bit line 112, ground line 114, shallow trench isolation (STI) 126, word lines 110, transistors 108, contacts 130, contacts 132, and phase-change elements 106. Bit line 112 and ground line 114 are in separate metallization layers. In one embodiment, bit line 112 comprises W or another suitable metal and is in a lower metallization layer than ground line 114, which comprises Al, Cu, or another suitable metal. In another embodiment, bit line 112 comprises Al, Cu, or another suitable metal and is in a higher metallization layer than ground line 114, which comprises W or another suitable metal. In one embodiment, bit line 112 and ground line 114 have substantially the same resistance/length.

Bit line 112 is spaced apart from ground line 114 by a width as indicated at 128a. In one embodiment, bit line 112 is parallel to ground line 114. One side of the source-drain path of each transistor 108 is electrically coupled to ground line 114 through a contact 132, which comprises Cu, W, or another suitable conductive material. The other side of the source-drain path of each transistor 108 is electrically coupled to a bit line 112 through a phase-change element 106 and contact 130, which comprises Cu, W, or another suitable electrically conductive material. The gate of each transistor 108 is electrically coupled to a word line 110, which comprises doped poly-Si, W, TiN, or another suitable material. In this embodiment, phase-change elements 106 are located between transistor 108 and bit line 112. In various embodiments, memory element 106 is a heater cell, an active-in-via cell, a pillar cell, or other suitable phase-change memory element. In the illustrated embodiment, by locating bit line 112 and ground line 114 in separate metallization layers, width 128a can be reduced to approximately zero to reduce the phase-change memory cell 104 size and therefore increase the density of the array of phase-change memory cells 100.

Figure 3A:
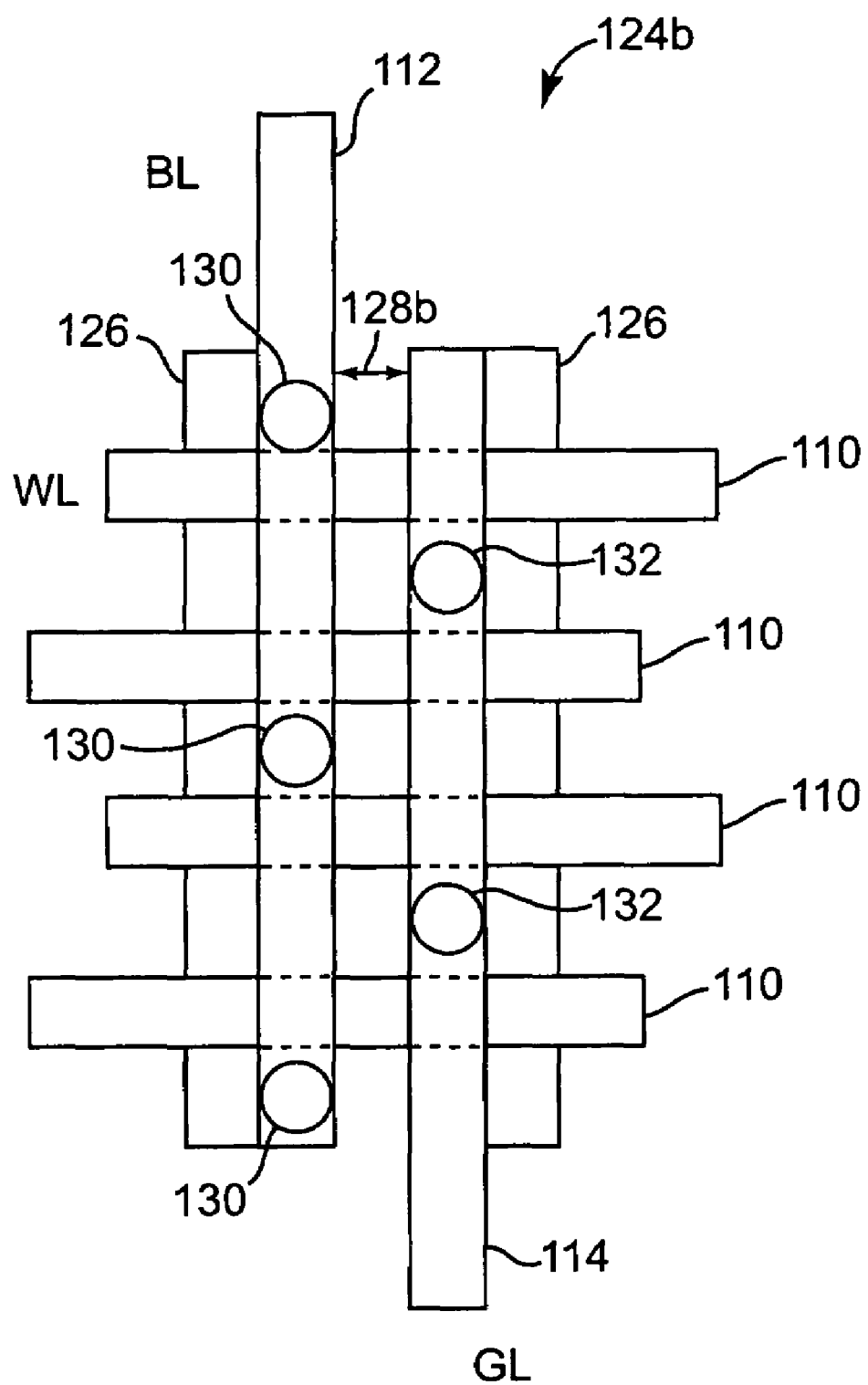
FIG. 3A illustrates a top view of another embodiment of a layout for dual gate phase-change memory cells.
Figure 3B:
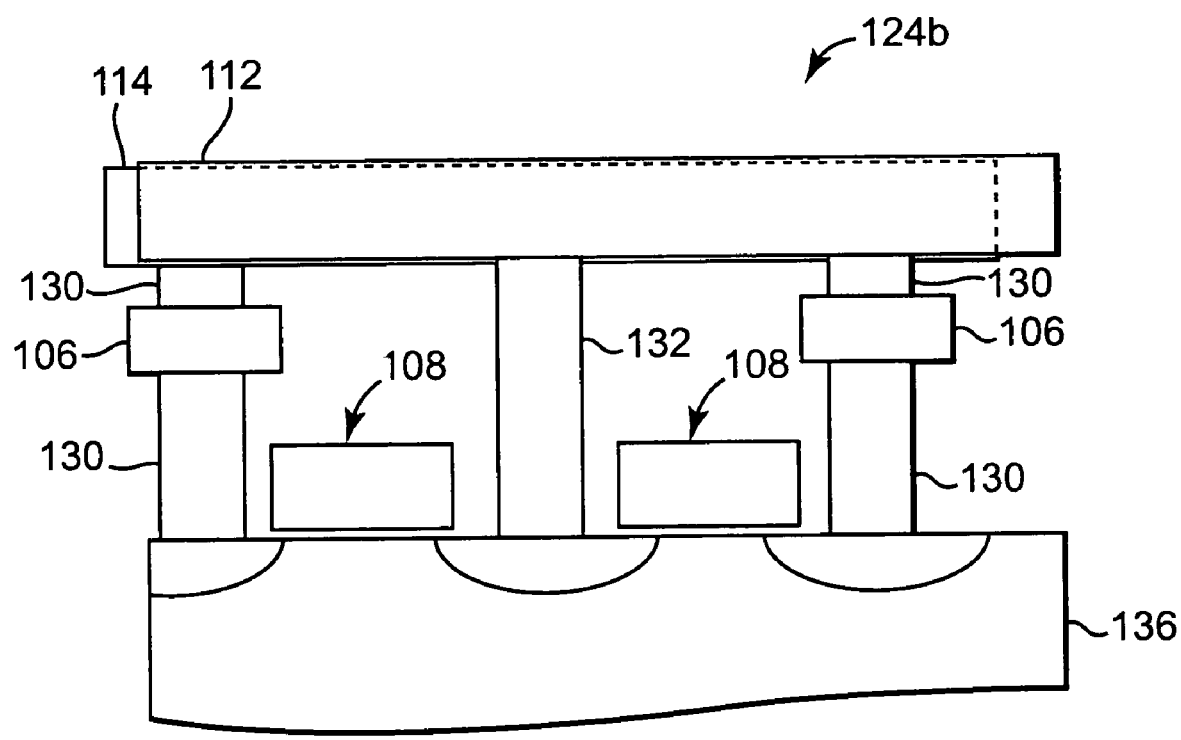
FIG. 3B illustrates a side view of another embodiment of a layout for dual gate phase-change memory cells.

FIG. 3A illustrates a top view and FIG. 3B illustrates a side view of another embodiment of a layout 124b for dual gate phase-change memory cells. Layout 124b is similar to layout 124a except that in layout 124b bit line 112 and ground line 114 are in the same metallization layer and the width 128b of the space between bit line 112 and ground line 114 is greater than width 128a (FIG. 2A). Since bit line 112 and ground line 114 are in the same metallization layer, width 128b is greater than width 128a to provide adequate isolation between bit line 112 and ground line 114. By locating bit line. 112 and ground line 114 in the same metallization layer, the resistance/length of bit line 112 and ground line 114 is easier to equalize than if bit line 112 and ground line 114 are in separate metallization layers. To equalize the resistance/length of bit line 112 and ground line 114 in the same metallization layer, the thickness of bit line 112 is made substantially equal to the thickness of ground line 114.

Figure 4A:
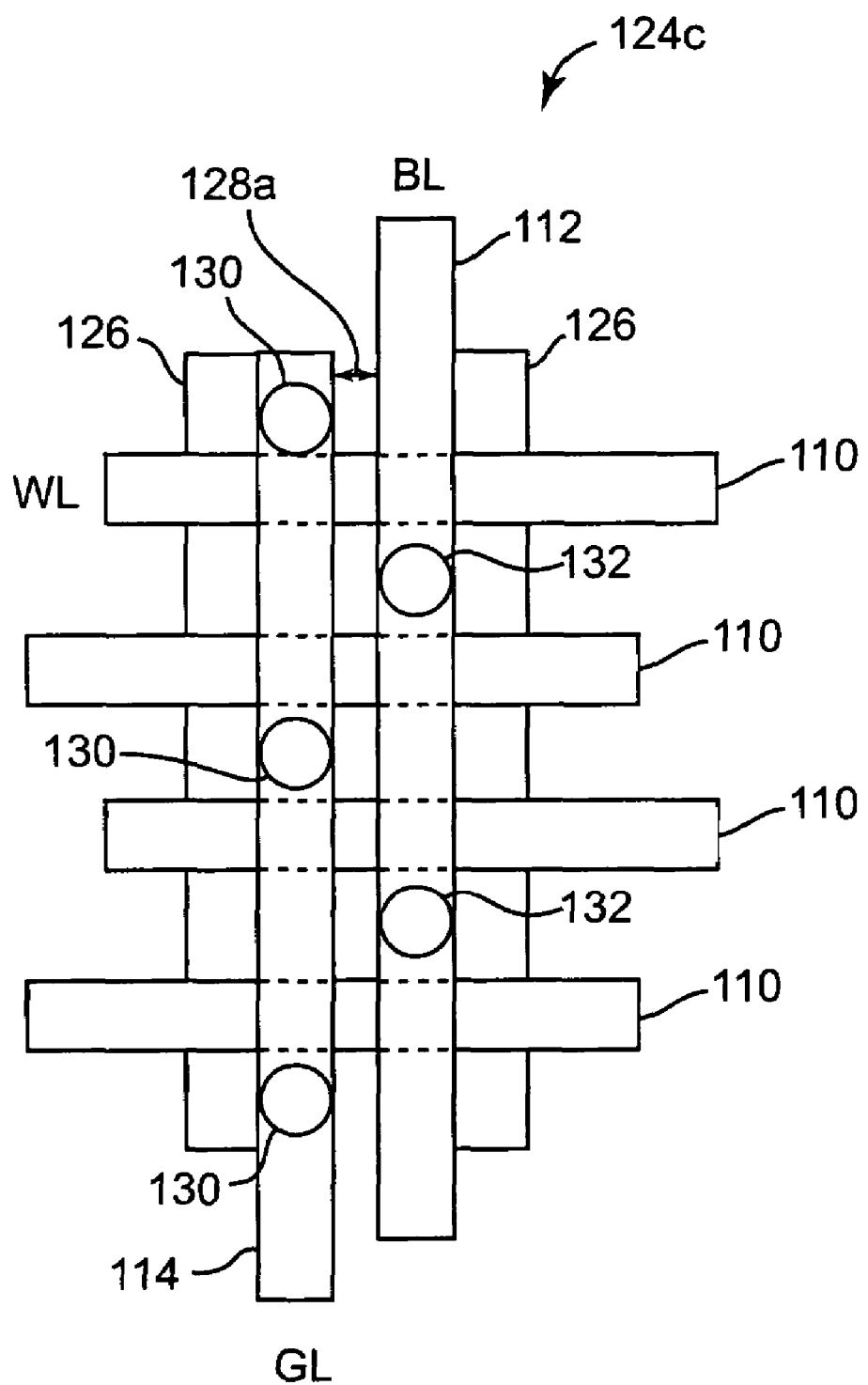
FIG. 4A illustrates a top view of another embodiment of a layout for dual gate phase-change memory cells.
Figure 4B:
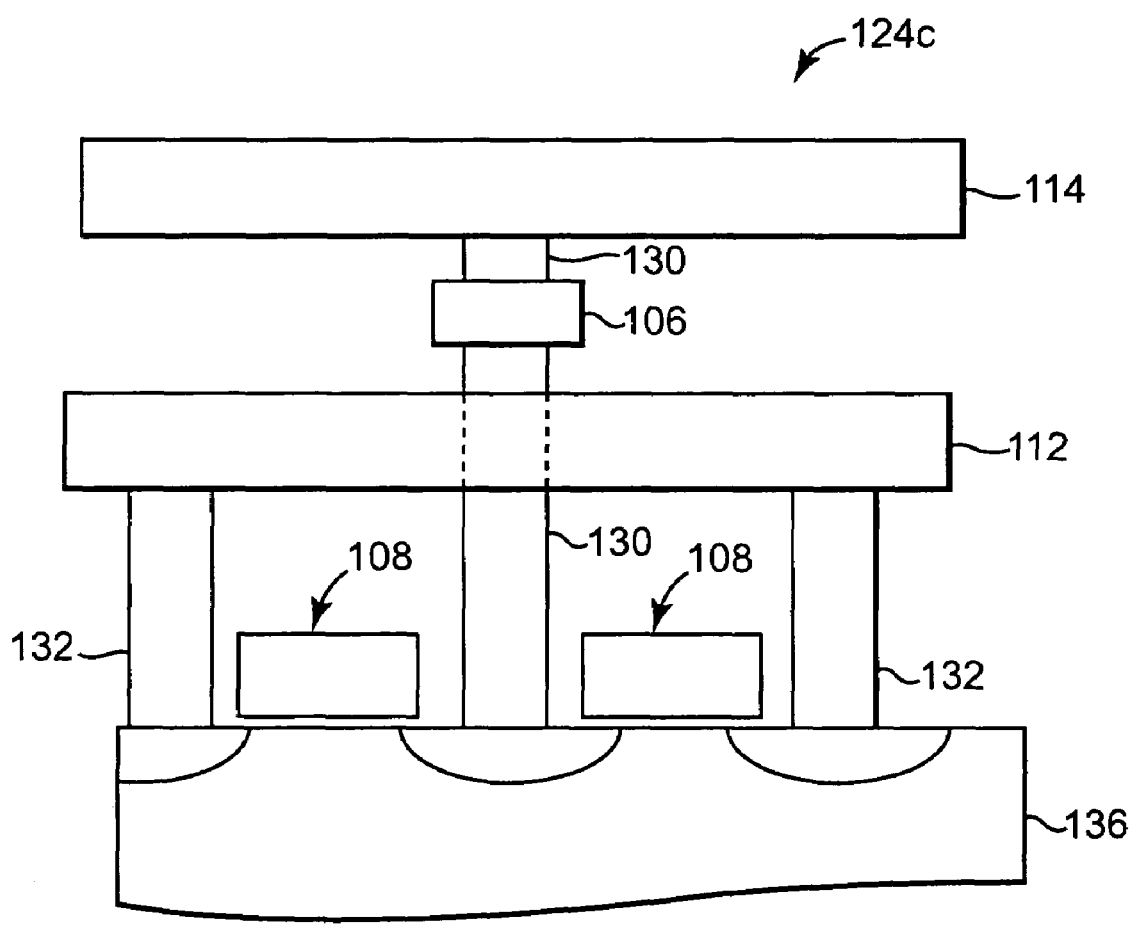
FIG. 4B illustrates a side view of another embodiment of a layout for dual gate phase-change memory cells.

FIG. 4A illustrates a top view and FIG. 4B illustrates a side view of another embodiment of a layout 124c for dual gate phase-change memory cells. Layout 124c is similar to layout 124a except that in layout 124c phase-change element 106 is between a transistor 108 and ground line 114 instead of between a transistor 108 and a bit line 112. Bit line 112 and ground line 114 are in separate metallization layers. In one embodiment, bit line 112 is in a higher metallization layer than ground line 114. In another embodiment, bit line 112 is in a lower metallization layer than ground line 114. Bit line 112 is parallel to ground line 114 and spaced apart from ground line 114 by a width as indicated at 128a. One side of the source-drain path of each transistor 108 is electrically coupled to ground line 114 through a phase-change element 106 and contact 130. The other side of the source-drain path of each transistor 108 is electrically coupled to a bit line 112 through contact 132. The gate of each transistor 108 is electrically coupled to a word line 110.

By fabricating phase-change element 106 after one or more of the metallization layers are deposited, the temperature budget available for processing these one or more metallization layers is improved. The improved temperature budget provides more options in selecting materials and processing methods. By locating bit line 112 and ground line 114 in separate metallization layers, width 128a can be reduced to approximately zero to reduce the phase-change memory cell 104 size and therefore increase the density of the array of phase-change memory cells 100.

Figure 5A:
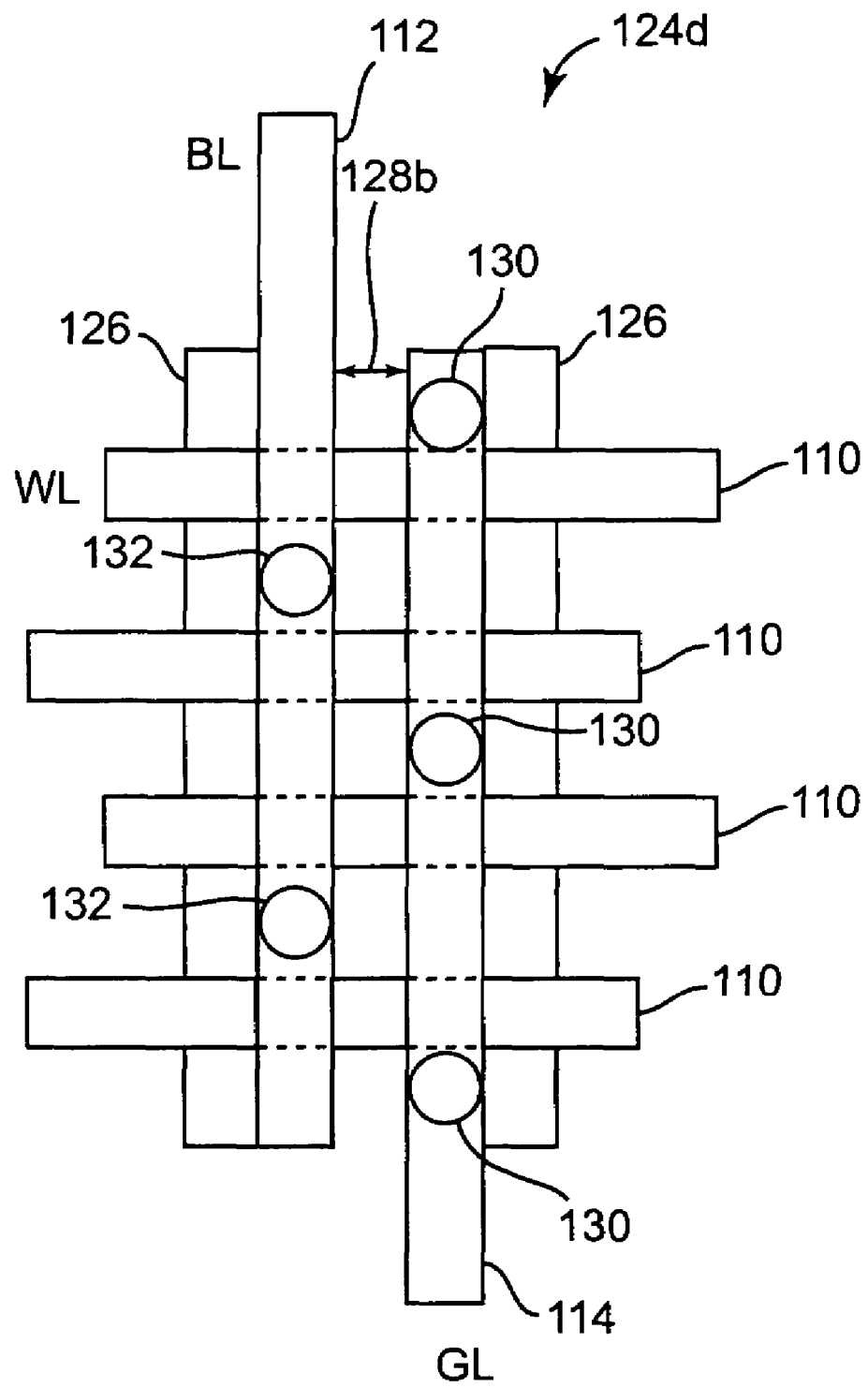
FIG. 5A illustrates a top view of another embodiment of a layout for dual gate phase-change memory cells.
Figure 5B:
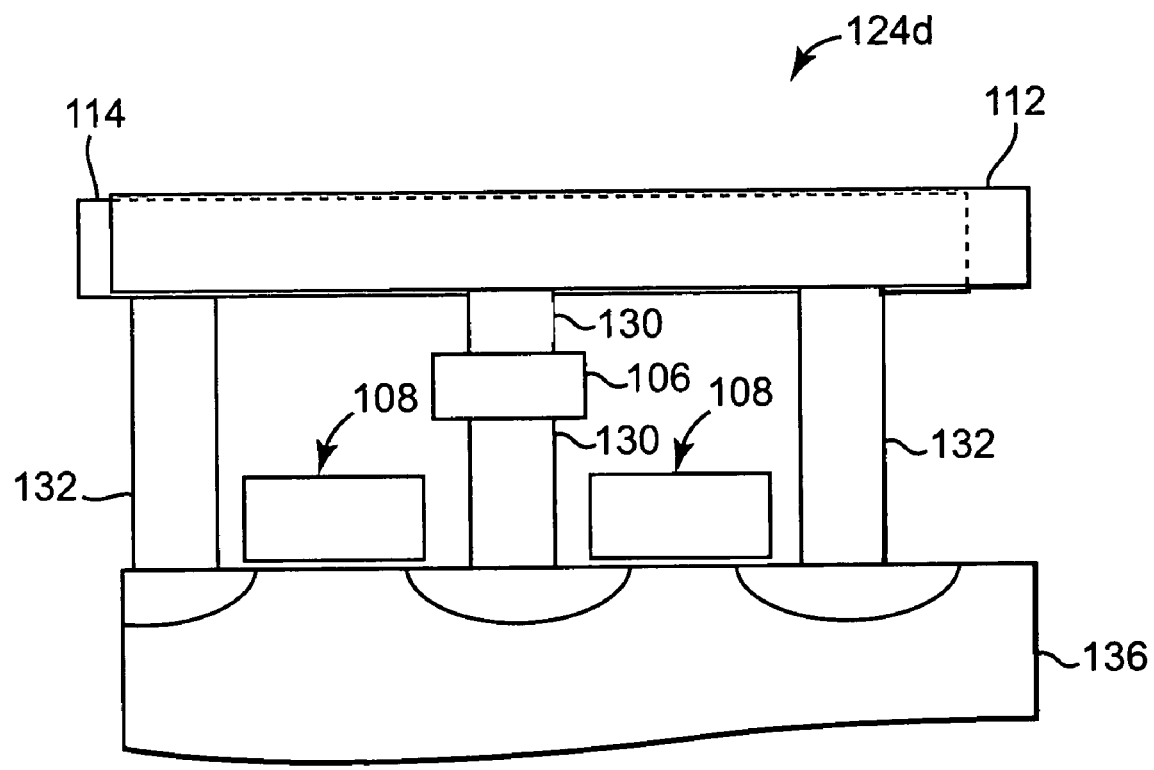
FIG. 5B illustrates a side view of another embodiment of a layout for dual gate phase-change memory cells.

FIG. 5A illustrates a top view and FIG. 5B illustrates a side view of another embodiment of a layout 124d for dual gate phase-change memory cells. Layout 124d is similar to layout 124c except that in layout 124d bit line 112 and ground line 114 are in the same metallization layer and the width 128b of the space between bit line 112 and ground line 114 is greater than width 128a (FIG. 4A). Since bit line 112 and ground line 114 are in the same metallization layer, width 128b is greater than width 128a to provide adequate isolation between bit line 112 and ground line 114. By locating bit line 112 and ground line 114 in the same metallization layer, the resistance/length of bit line 112 and ground line 114 is easier to equalize than if bit line 112 and ground line 114 are in separate metallization layers. To equalize the resistance/length of bit line 112 and ground line 114 in the same metallization layer, the thickness of bit-line 112 is made substantially equal to the thickness of ground line 114.

Figure 6A:
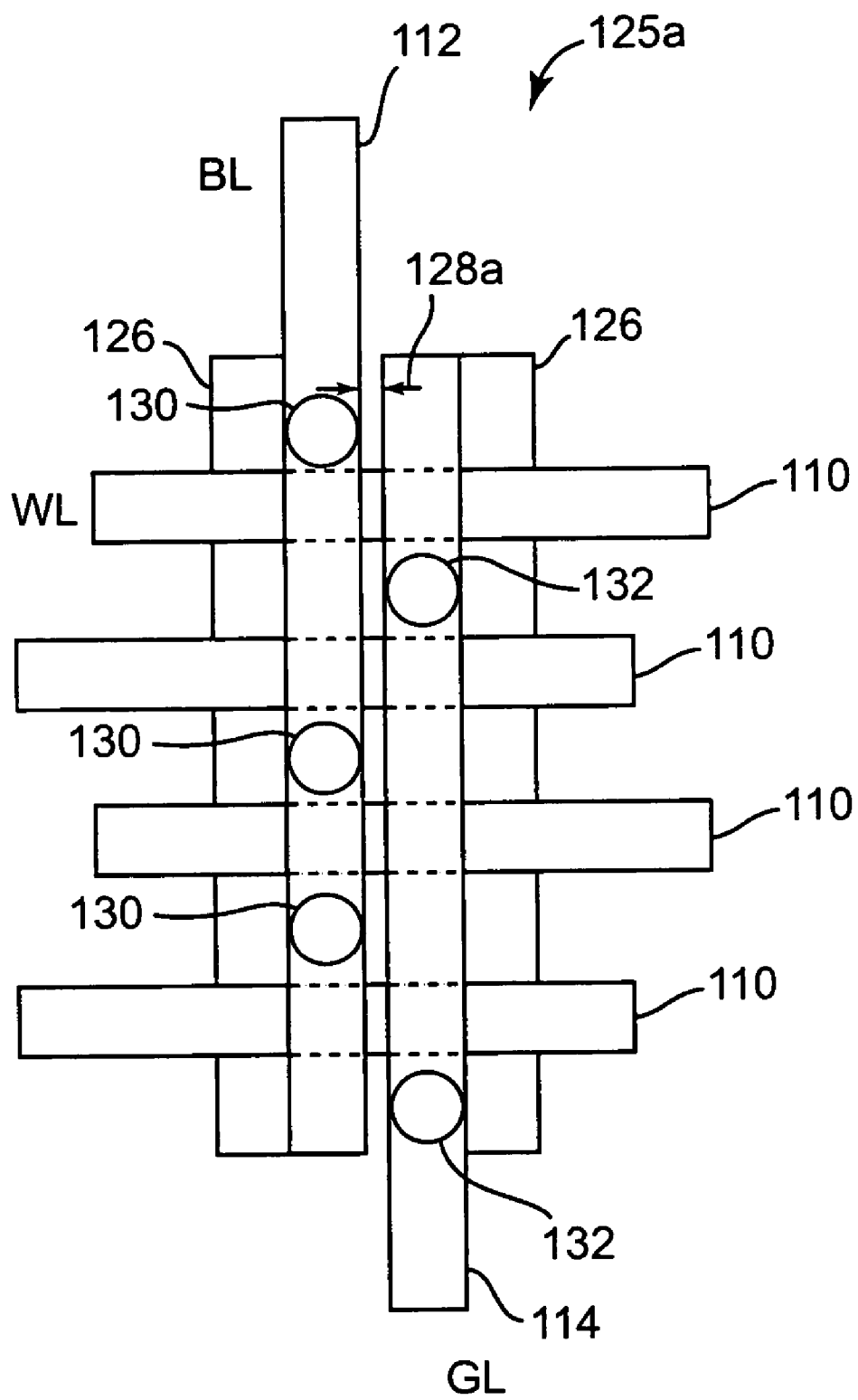
FIG. 6A illustrates a top view of one embodiment of a layout for single gate phase-change memory cells.
Figure 6B:
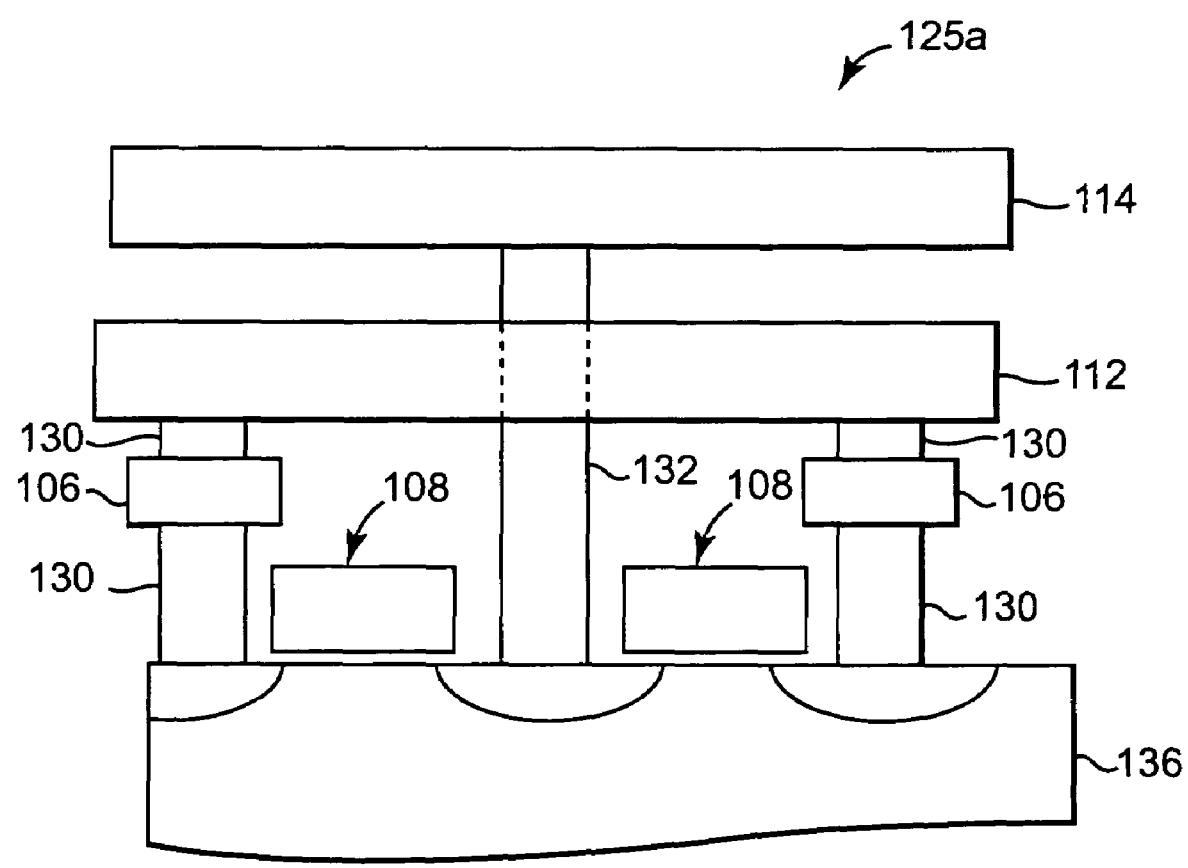
FIG. 6B illustrates a side view of one embodiment of a layout for single gate phase-change memory cells.

FIG. 6A illustrates a top view and FIG. 6B illustrates a side-view of one embodiment of a layout 125a for single gate phase-change memory cells. Single gate phase-change memory cells include one transistor 108 to support one phase-change element 106. Layout 125a includes substrate 136, bit line 112, ground line 114, shallow trench isolation (STI) 126, word lines 110, transistors 108, contacts 130, contacts 132, and phase-change elements 106. Bit line 112 and ground line 114 are in separate metallization layers. In one embodiment, bit line 112 is in a higher metallization layer than ground line 114. In another embodiment, bit line 112 is in a lower metallization layer than ground line 114.

Bit line 112 is parallel to ground line 114 and spaced apart from ground line 114 by a width as indicated at 128a. One side of the source-drain path of each transistor 108 is electrically coupled to ground line 114 through a contact 132. The other side of the source-drain path of each transistor 108 is electrically coupled to a bit line 112 through a phase-change element 106 and contact 130. The gate of each transistor 108 is electrically coupled to a word line 110. In this embodiment, each phase-change element 106 is located between a transistor 108 and a bit line 112. In one embodiment, memory element 106 is a heater cell, an active-in-via cell, a pillar cell, or other suitable phase-change memory element. By locating bit line 112 and ground line 114 in separate metallization layers, width 128a can be reduced to approximately zero to reduce the phase-change memory cell 104 size and therefore increase the density of the array of phase-change memory cells 100.

Figure 7A:
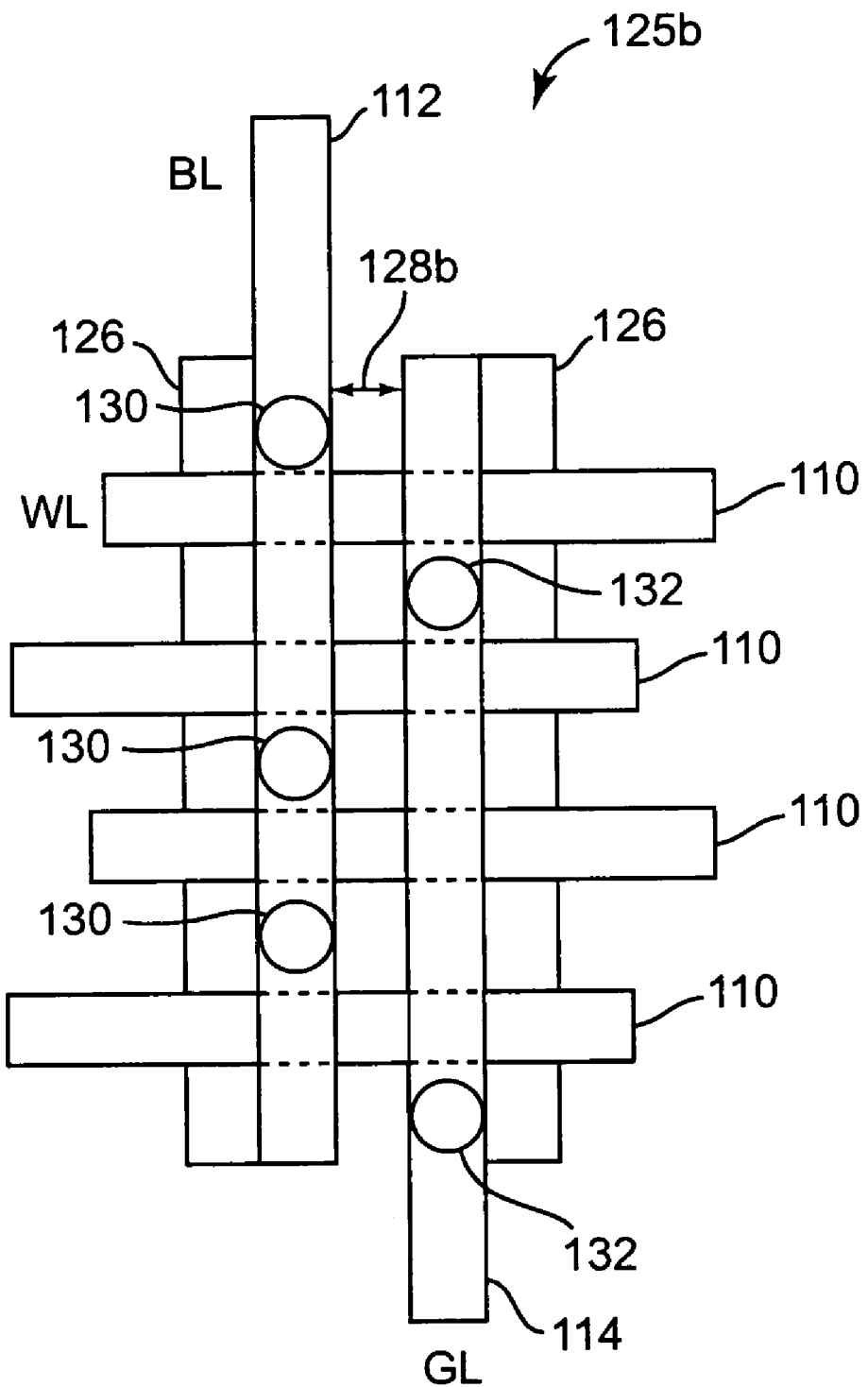
FIG. 7A illustrates a top view of another embodiment of a layout for single gate phase-change memory cells.
Figure 7B:
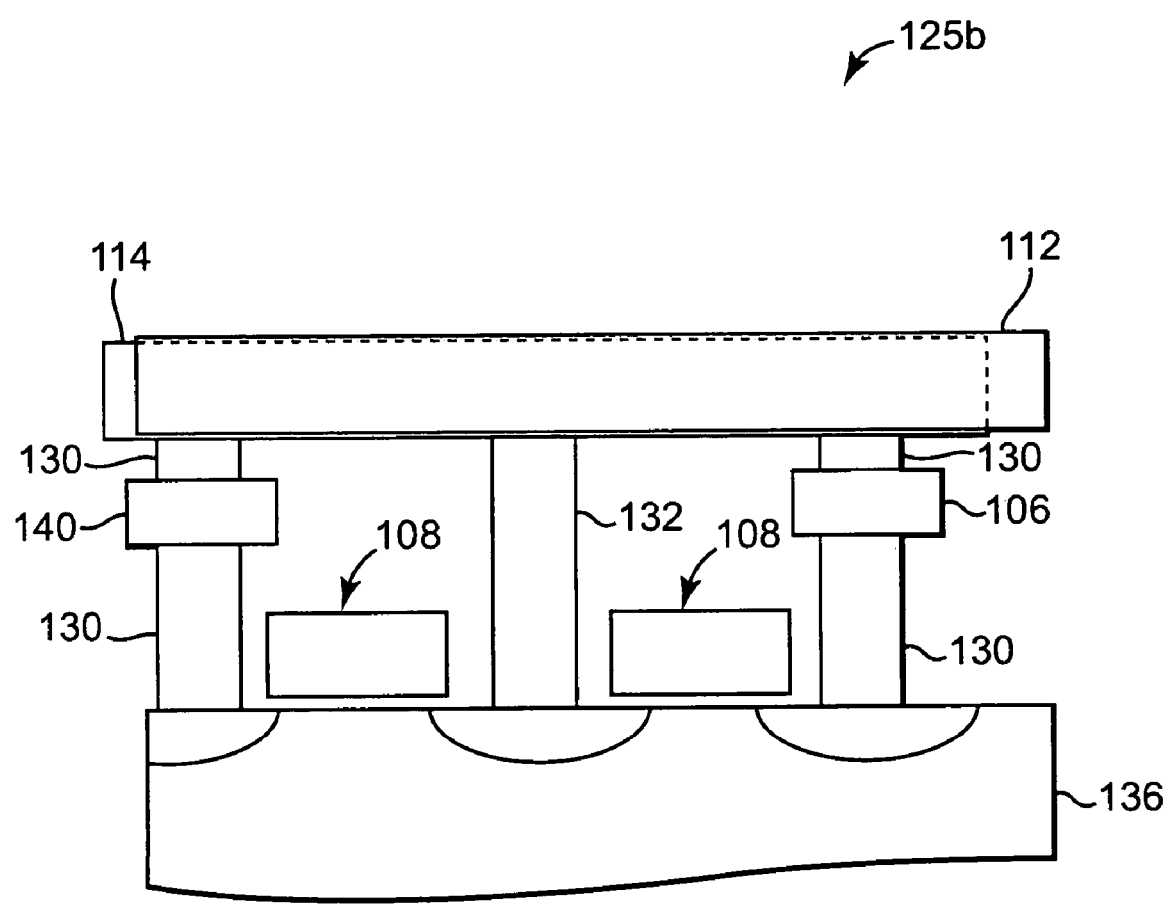
FIG. 7B illustrates a side view of another embodiment of a layout for single gate phase-change memory cells.

FIG. 7A illustrates a top view and FIG. 7B illustrates a side view of another embodiment of a layout 125b for single gate phase-change memory cells. Layout 125b is similar to layout 125a except that in layout 125b bit line 112 and ground line 114 are in the same metallization layer and the width 128b of the space between bit line 112 and ground line 114 is greater than width 128a (FIG. 6A). Since bit line 112 and ground line 114 are in the same metallization layer, width 128b is greater than width 128a to provide adequate isolation between bit line 112 and ground line 114. By locating bit line 112 and ground line 114 in the same metallization layer, the resistance/length of bit line 112 and ground line 114 is easier to equalize than if bit line 112 and ground line 114 are in separate metallization layers. To equalize the resistance/length of bit line 112 and ground line 114 in the same metallization layer, the thickness of bit line 112 is made substantially equal to the thickness of ground line 114.

Figure 8A:
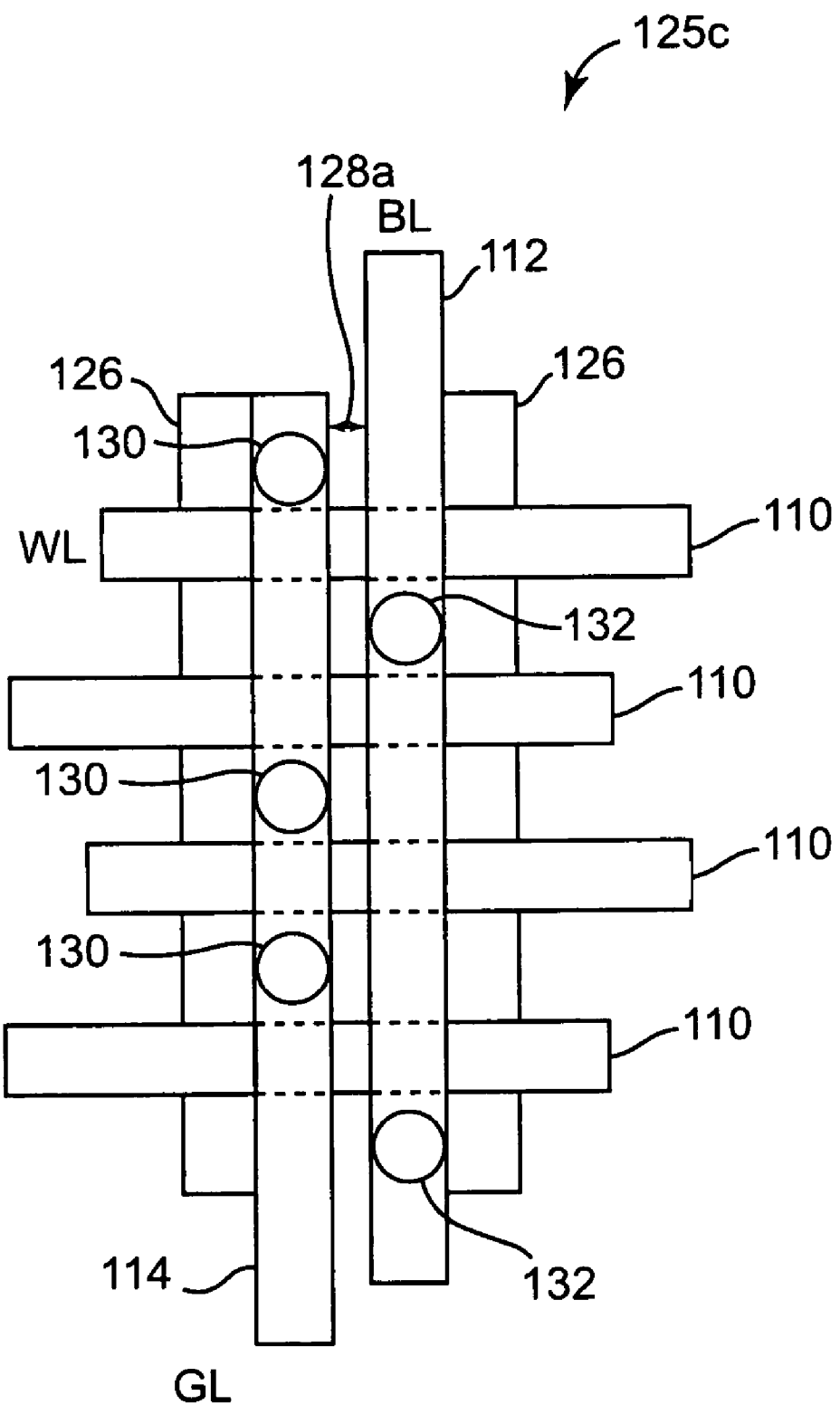
FIG. 8A illustrates a top view of another embodiment of a layout for single gate phase-change memory cells.
Figure 8B:
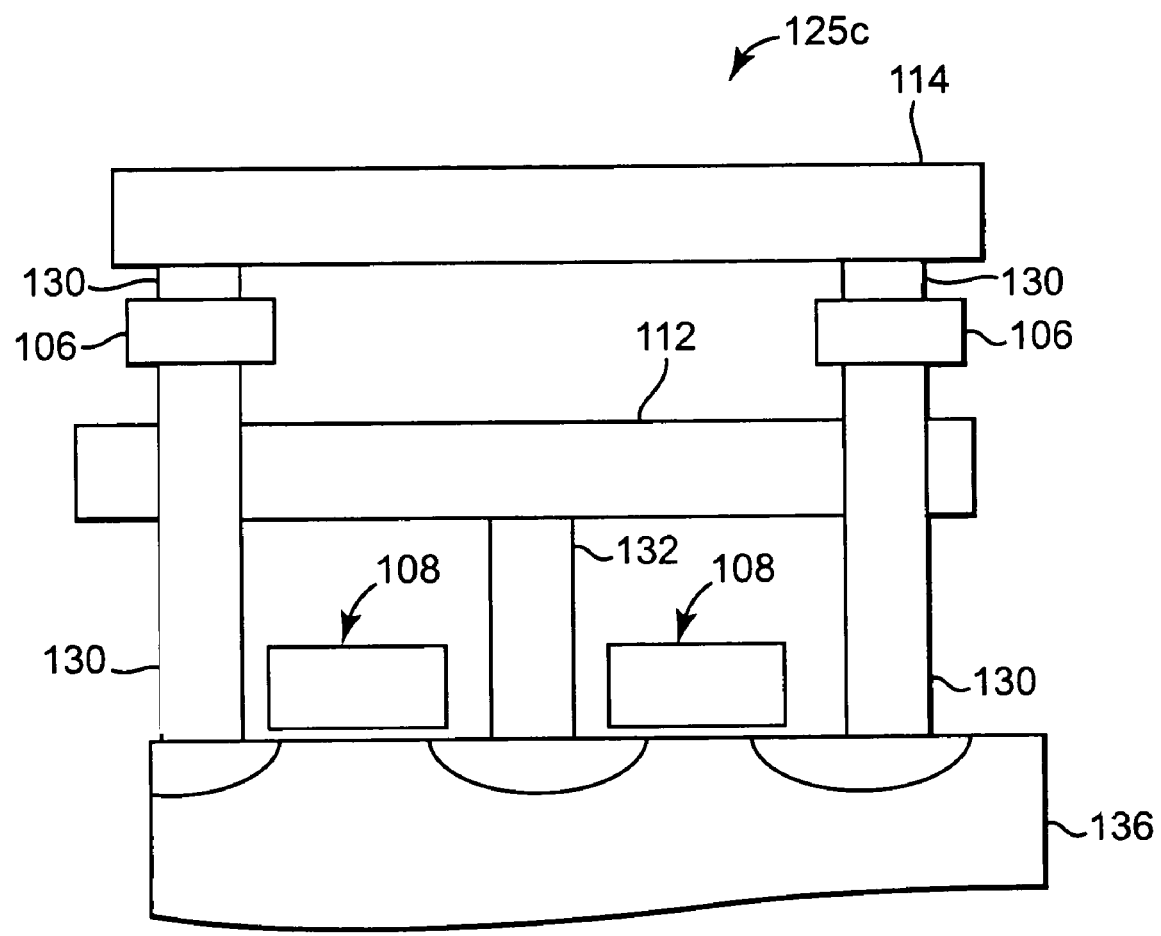
FIG. 8B illustrates a side view of another embodiment of a layout for single gate phase-change memory cells.

FIG. 8A illustrates a top view and FIG. 8B illustrates a side view of another embodiment of a layout 125c for single gate phase-change memory cells. Layout 125c is similar to layout 125a except that in layout 125c each phase-change element 106 is between a transistor 108 and a ground line 114 instead of between a transistor 108 and a bit line 112. Bit line 112 and ground line 114 are in separate metallization layers. In one embodiment, bit line 112 is in a higher metallization layer than ground line 114. In another embodiment, bit line 112 is in a lower metallization layer than ground line 114. Bit line 112 is parallel to ground line 114 and spaced apart from ground line 114 by a width as indicated at 128a. One side of the source-drain path of each transistor 108 is electrically coupled to ground line 114 through a phase-change element 106 and contact 130. The other side of the source-drain path of each transistor 108 is electrically coupled to a bit line 112 through contact 132. The gate of each transistor 108 is electrically coupled to a word line 110.

By locating phase-change element 106 in the back end of the line, the temperature budget available for processing of the lower metallization is improved. The improved temperature budget provides more options in selecting materials and processing methods. By locating bit line 112 and ground line 114 in separate metallization layers, width 128a can be reduced to approximately zero to reduce the phase-change memory cell 104 size and therefore increase the density of the array of phase-change memory cells 100.

Figure 9A:
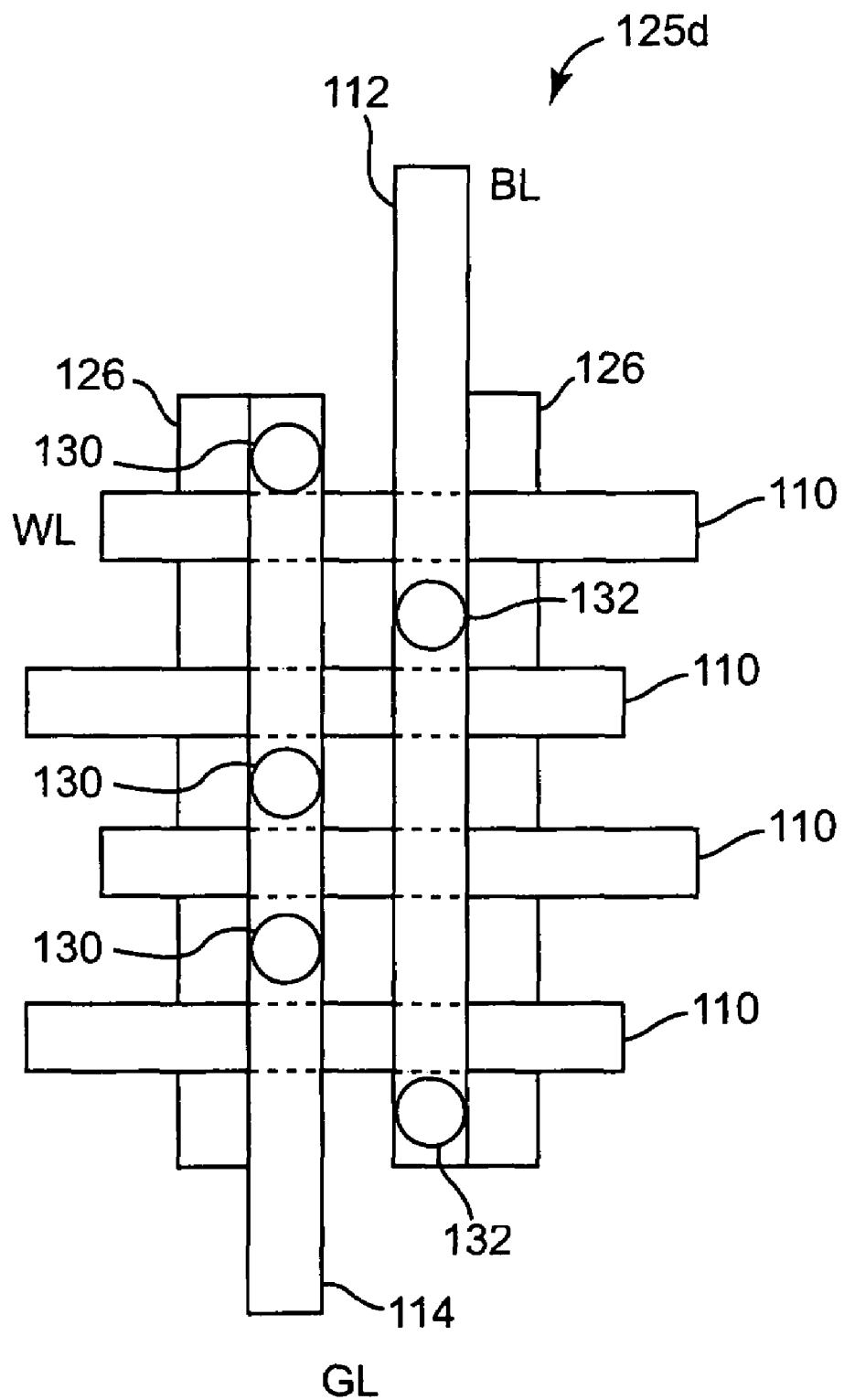
FIG. 9A illustrates a top view of another embodiment of a layout for single gate phase-change memory cells.
Figure 9B:
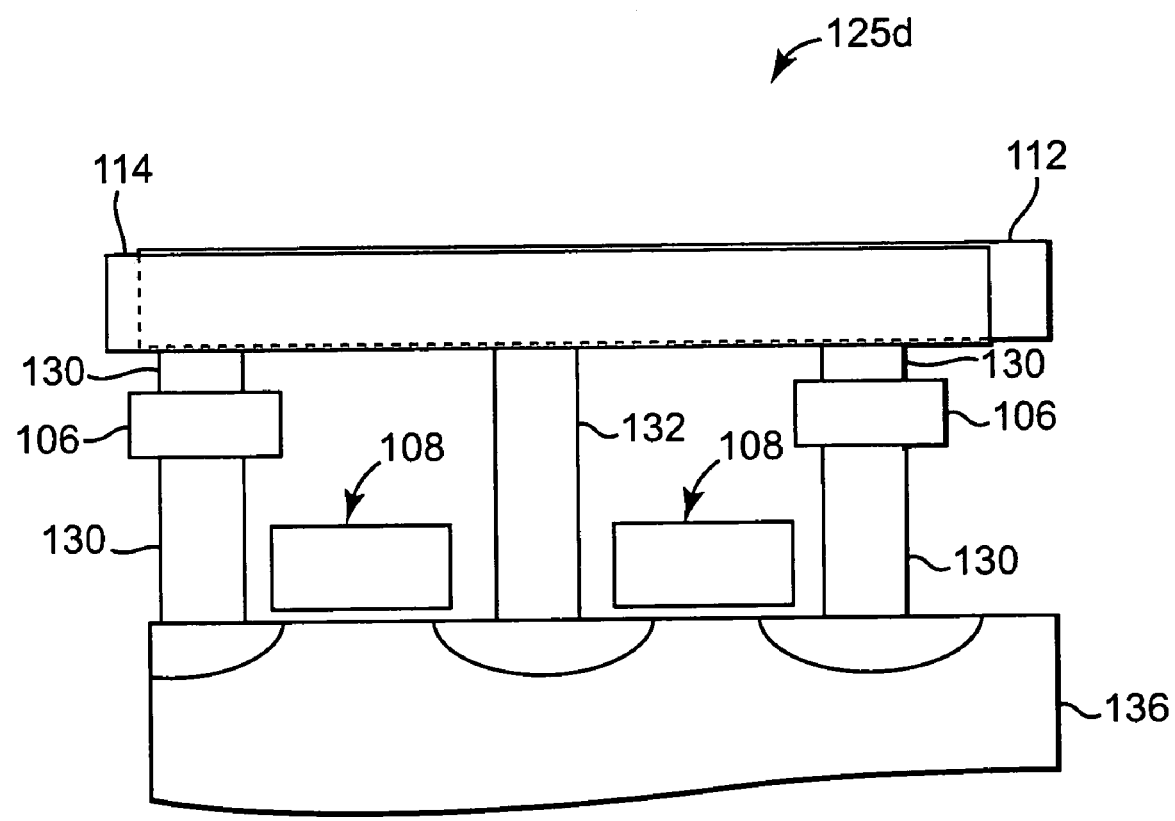
FIG. 9B illustrates a side view of another embodiment of a layout for single gate phase-change memory cells.

FIG. 9A illustrates a top view and FIG. 9B illustrates a side view of another embodiment of a layout 125d for single gate phase-change memory cells. Layout 125d is similar to layout 125c except that in layout 125d bit line 112 and ground line 114 are in the same metallization layer and the width 128b of the space between bit line 112 and ground line 114 is greater than width 128a (FIG. 8A). Since bit line 112 and ground line 114 are in the same metallization layer, width 128b is greater than width 128a to provide adequate isolation between bit line 112 and ground line 114. By locating bit line 112 and ground line 114 in the same metallization layer, the resistance/length of bit line 112 and ground line 114 is easier to equalize than if bit line 112 and ground line 114 are in separate metallization layers. To equalize the resistance/length of bit line 112 and ground line 114 in the same metallization layer, the thickness of bit line 112 is made substantially equal to the thickness of ground line 114.

Embodiments of the present invention provide phase-change memory array layouts for equalizing the parasitic series resistance due to bit lines and ground lines at each phase-change memory cell. The parasitic series resistance is equalized since the ground lines and bit lines are parallel to each other and are connected at opposite sides of the memory array. The layout of the phase-change memory cells can vary by locating the phase-change memory element between the transistor and the bit line or between the transistor and the ground line. The layout of the phase-change memory cells can also vary by locating the ground line and the bit line in the same metallization layer or in separate metallization layers. The embodiments provide an improved phase-change memory cell resistance distribution.

What is claimed is:

1. An integrated circuit having a memory comprising:
    resistive memory cells;
    a first line coupled to the resistive memory cells; and
    a second line coupled to the resistive memory cells,
    wherein a series resistance of the first line plus the second line at each one of the resistive memory cells is substantially equal.

2. The integrated circuit of claim 1, wherein the first line and the second line have substantially the same resistance per unit length.

3. The integrated circuit of claim 1, wherein the first line and the second line are located in separate metallization layers.

4. The integrated circuit of claim 1, wherein the first line and the second line are located in a same metallization layer.

5. The integrated circuit of claim 1, wherein the resistive memory cells each comprise a phase-change element.

6. The integrated circuit of claim 1, wherein the resistive memory cells each comprise a transistor coupled to a phase-change element, and wherein the transistor and the phase-change element for each one of the resistive memory cells are coupled between the first line and the second line.

7. A memory comprising:
    an array of phase-change memory cells;
    bit lines coupled to each of the phase-change memory cells; and
    ground lines parallel to the bit lines and coupled to each of the phase-change memory cells,
    wherein the bit lines are connected at a first side of the array of phase-change memory cells and the ground lines are connected at a second side of the array of phase-change memory cells opposite the first side, and
    wherein the bit lines and the ground lines have substantially the same resistance/length.

8. The memory of claim 7, wherein the bit lines are located in a first metallization layer and the ground lines are located in a second metallization layer.

9. The memory of claim 7, wherein the bit lines and the ground lines are located in a same metallization layer.

10. The memory of claim 7, wherein each phase-change memory cell comprises a transistor and a phase-change element coupled between the transistor and a bit line.

11. The memory of claim 7, wherein each phase-change memory cell comprises a transistor and a phase change element coupled between the transistor and a ground line.

12. A method for fabricating a memory, the method comprising:
    providing an array of phase-change memory cells;
    providing bit lines coupled to each of the phase-change memory cells;
    providing, ground lines parallel to the bit lines and coupled to each of the phase-change memory cells;
    connecting the bit lines to a first side of the array of phase-change memory cells; and
    connecting the ground lines to a second side of the array of phase-change memory cells opposite the first side,
    wherein the bit lines and the ground lines have substantially the same resistance/length.

13. The memory of claim 12, wherein providing the bit lines comprises providing the bit lines in a separate metallization layer from the ground lines.

14. The memory of claim 12, wherein providing the ground lines comprises providing the ground lines in a same metallization layer as the bit lines.

15. The memory of claim 12, wherein providing the array of phase-change memory cells comprises providing a transistor and a phase-change element between the transistor and a bit line for each phase-change memory cell.

16. The memory of claim 12, wherein providing the array of phase-change memory cells comprises providing a transistor and a phase change element between the transistor and a ground line for each phase-change memory cell.

* * * * *